United States Patent [19]
Schmitt et al.

[11] Patent Number: 5,586,003
[45] Date of Patent: Dec. 17, 1996

[54] COMPUTER DEVICE CARRIER DOOR AND BAY FILLER PANEL COMBINATION INCLUDING GEAR AND GUIDE PIN

[75] Inventors: Ty Schmitt, Round Rock; Jerry Gandre, Austin, both of Tex.

[73] Assignee: Dell USA, L.P., Austin, Tex.

[21] Appl. No.: 485,196

[22] Filed: Jun. 7, 1995

[51] Int. Cl.⁶ .............................. G06F 1/16; H05K 7/10; F16H 21/44; H01R 13/62
[52] U.S. Cl. ......................... 361/683; 361/684; 361/685; 361/727; 74/109; 312/332.1; 439/157
[58] Field of Search .......................... 364/708.1; 74/109; 312/332.1, 333; 439/135, 152, 153, 155, 157, 159, 160, 310, 372; 361/683–686, 607–609, 724–727, 731, 732, 740, 741, 754, 769, 796–798, 801

[56] References Cited

U.S. PATENT DOCUMENTS

| | | | |
|---|---|---|---|
| 4,941,835 | 7/1990 | Lasmayoux et al. | 439/152 |
| 5,211,566 | 5/1993 | Bates et al. | 439/928.1 X |
| 5,229,919 | 7/1993 | Chen | 361/685 |
| 5,325,263 | 6/1994 | Singer et al. | 361/685 X |

Primary Examiner—Michael W. Phillips
Attorney, Agent, or Firm—Haynes and Boone, L.L.P.

[57] ABSTRACT

A computer device carrier door and bay filler panel combination for sealing a bay in a computer chassis. The door and filler combination includes a door having a mount attached thereto, and a mounting rail for engaging the mount. The rail has an arcuate alignment channel with one open end and an attached rack. The mount includes a pinion gear to rotatably engage the rack as the door is opened and closed and a guide pin which enters the open end of the channel when the door is open and travels within the channel as the door is opened and closed.

28 Claims, 5 Drawing Sheets

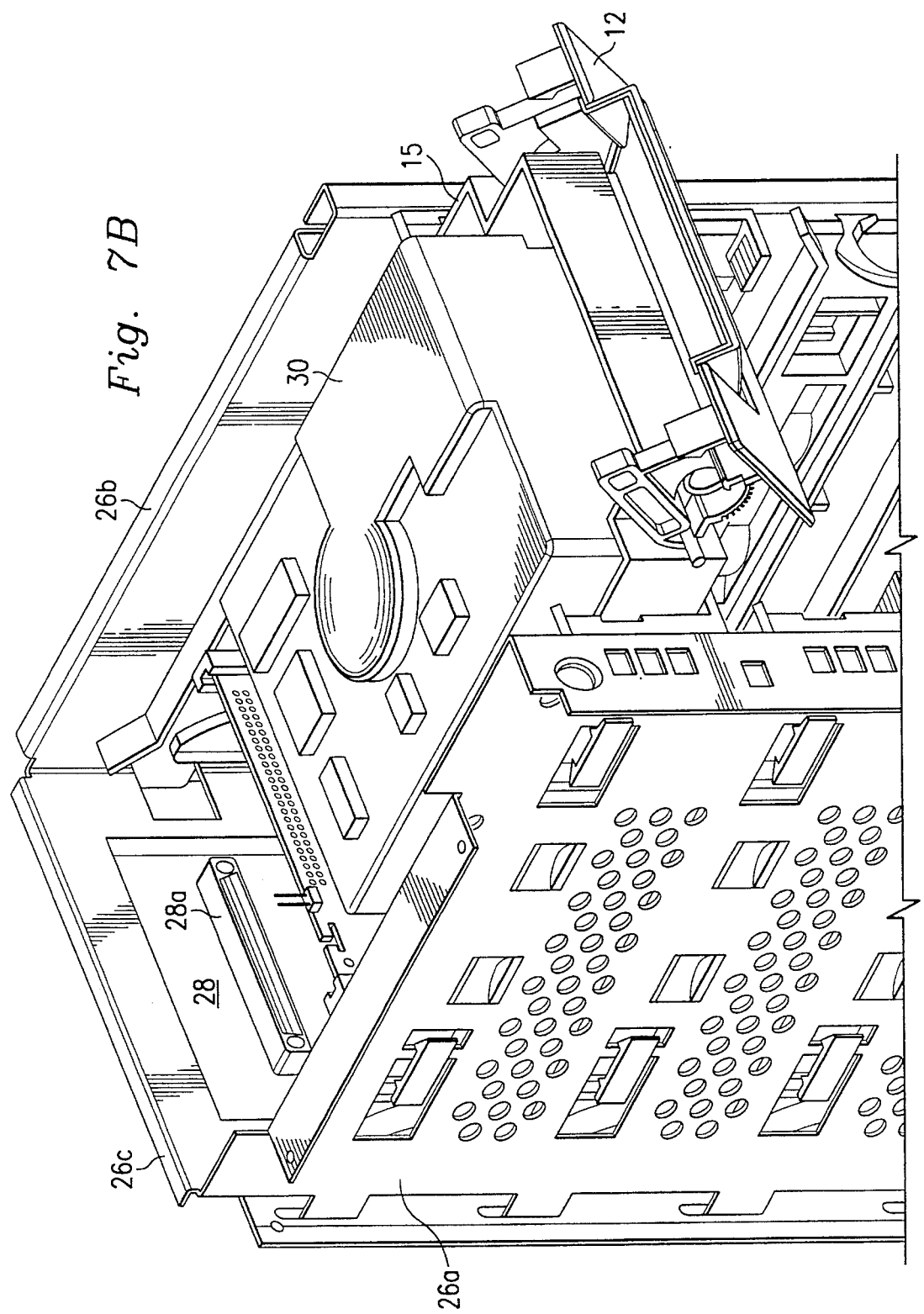

5,586,003

COMPUTER DEVICE CARRIER DOOR AND BAY FILLER PANEL COMBINATION INCLUDING GEAR AND GUIDE PIN

TECHNICAL FIELD

The invention relates generally to personal computer chassis designs and more specifically, to a computer device carrier door and bay filler panel combination.

BACKGROUND OF THE INVENTION

Computer systems utilize a number of storage mediums and associated devices to store data required by the system and its users. These storage devices are generally placed in bays within a computer chassis. In many computer systems it is essential that these devices are easily accessible so as to not disturb the other devices or the system as a whole when they are inserted or removed. Accordingly, computer manufacturers have begun to provide external openings in computer chassis which provide direct access to the bays and the devices located therein without requiring access to other components of the computer system.

In order to insert these devices into their respective bays, carriers are frequently used as platforms to hold each device. These carriers are designed to secure each device and provide for smooth insertion into a bay and to assure a proper electrical connection between the device and the system. However, most carrier designs require the individual inserting the device to apply force directly to the carrier, either through pushing or pulling, to connect the device to the computer system, usually by a male connector on the back of the device and a female connector on a system board at the back of the bay. Further, in an attempt to insert or remove a device from the system, the individual often applies force to the device in a direction non-parallel to the connector. By application of such forces connector pins are often bent and the stress placed on the system board, into which the device is connected, can lead to system failures.

In order to provide insulation against dirt and dust invasion, and restrict individuals from inserting foreign objects into the chassis which could cause catastrophic failure to the system, the carriers are often provided with doors which serve to seal the bay after device insertion. When a bay is not in use, filler panels are provided which seal the chassis. These filler panels are semi-permanent in nature and are placed in the chassis after the initial device configuration is determined. As a result, the filler panels are generally difficult to remove and, once removed, are difficult to reattach to the chassis. In order to alleviate some of these difficulties, a complete carrier and door combination is sometimes used in lieu of the filler panel. However, these components are often never used in connection with a device and add unnecessary costs to the system.

As a consequence, there exists a need for an apparatus which provides for consistent and controlled device insertion and which serves as a filler panel when a bay is not in use and which serves as a carrier door when a bay is occupied.

SUMMARY OF THE INVENTION

The combination device carrier door and filler panel mounting apparatus of the present invention avoids and overcomes the above-mentioned disadvantages and drawbacks characteristic of the prior art. According to the present invention and in a departure from the prior art, the device carrier door and filler panel mounting apparatus consists of a door having a mount attached thereto and a mounting rail for engaging the mount. The mounting rail has an arcuate alignment channel with one open end and an attached rack. The mount further comprises a pinion gear to rotatably engage the rack as the door is opened and closed and a guide pin which enters the open end of the channel when the door is open and travels within the channel as the door is opened and closed.

In another embodiment of the invention a snap grip is attached to the mounting rail and a snap is attached to the door wherein the snap engages the grip when the door is closed. Further, an alignment rib is attached to the door which extends within the open end of the channel when the door is closed to align the door to the mounting rail.

In another embodiment of the invention a device carrier is rotatably attached to the door and which slidably engages the mounting rail. The mounts may each contain a pivot hole, one of which contains alignment notches proximate thereto. The carrier contains a pair of posts to rotatably attach the carrier to the door. One of the posts also contains a number of tabs corresponding to the number of alignment notches to permit the tabbed post to be inserted into the notched hole in only one orientation and restricts insertion of the tabbed post from insertion into the non-notched pivot hole.

The invention results in several technical advantages. Generally, the door may be used in connection with a carrier or as a filler panel. When the door is used in connection with a carrier and an associated device, the carrier, and thus the device, are inserted into the bay in a controlled manner to avoid damage to the device, connector and system board.

BRIEF DESCRIPTION OF THE DRAWINGS

FIG. 7B is a partial overhead view of the computer device carrier and bay filler panel combination installed in a computer chassis as shown in FIG. 7A, with the attached carrier partially removed from the computer chassis.

DESCRIPTION OF THE PREFERRED EMBODIMENT

Figure 1A:
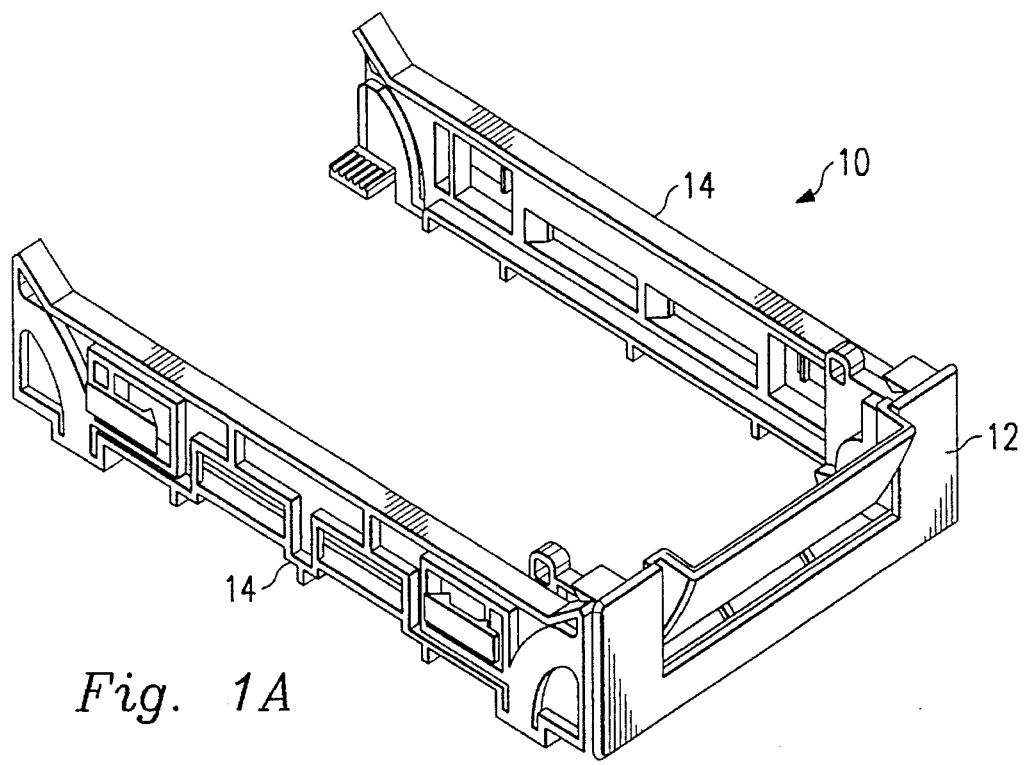
FIG. 1A is a perspective view of the computer device carrier door and bay filler panel combination of the present invention.

In FIG. 1A the reference numeral 10 refers generally to the computer device carrier door and bay filler panel combination of the present invention with the door/filler 12 in the fully closed position and secured to two mounting rails 14. It is understood that the mounting rails 14 are secured on either side of a bay within a computer chassis (shown in FIGS. 7A–B) and may be used to support a carrier (shown in FIG. 1B) holding a computer device (shown in FIG. 7B) such as a hard drive or other storage device for connection to the computer system. In accordance with the present invention, it is appreciated that the door/filler 12 may be used either in connection with a carrier or as a filler panel that seals the bay opening in the computer chassis.

Figure 1B:
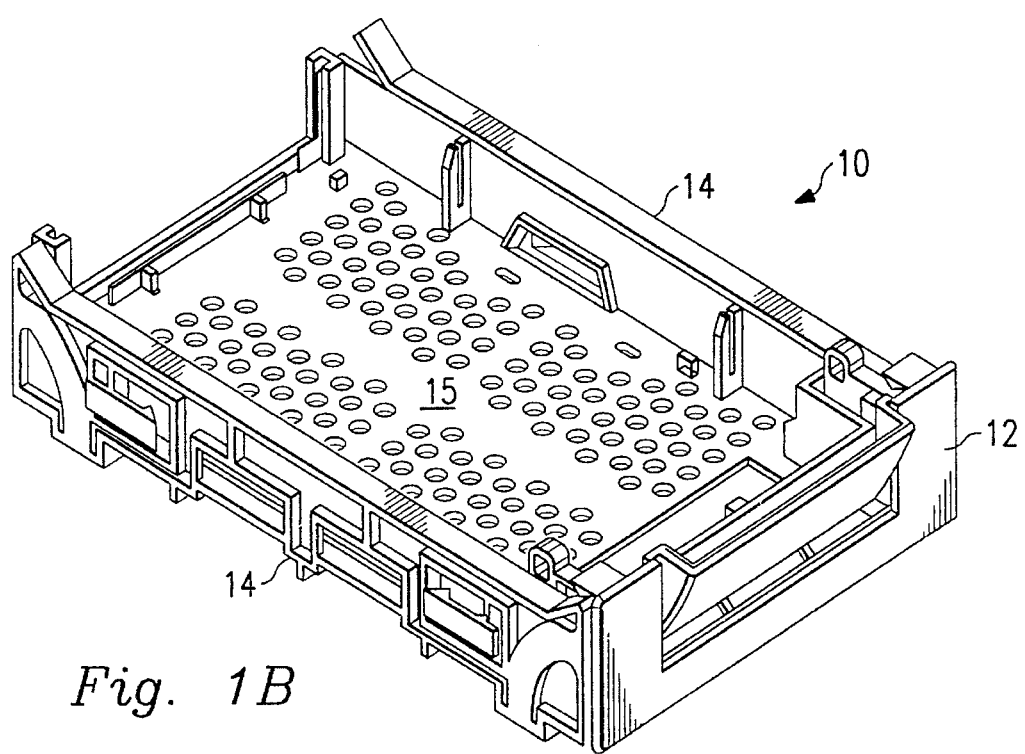
FIG. 1B is a perspective view of the computer device carrier door and bay filler panel combination shown in FIG. 1A with an attached carrier.

FIG. 1B is a perspective view of the computer device carrier door and bay filler panel combination of FIG. 1A used to support a carrier 15. The carrier 15 is shown attached to the door/filler 12 and secured between the mounting rails 14. When the door/filler 12 is used in connection with a carrier 15 and an associated device, it is appreciated that the carrier 15, and thus the device, must be inserted into the bay in a controlled manner to avoid damage to the device, connector and system board, which, as will be explained in detail below, are facilitated by the present invention.

Figure 2:
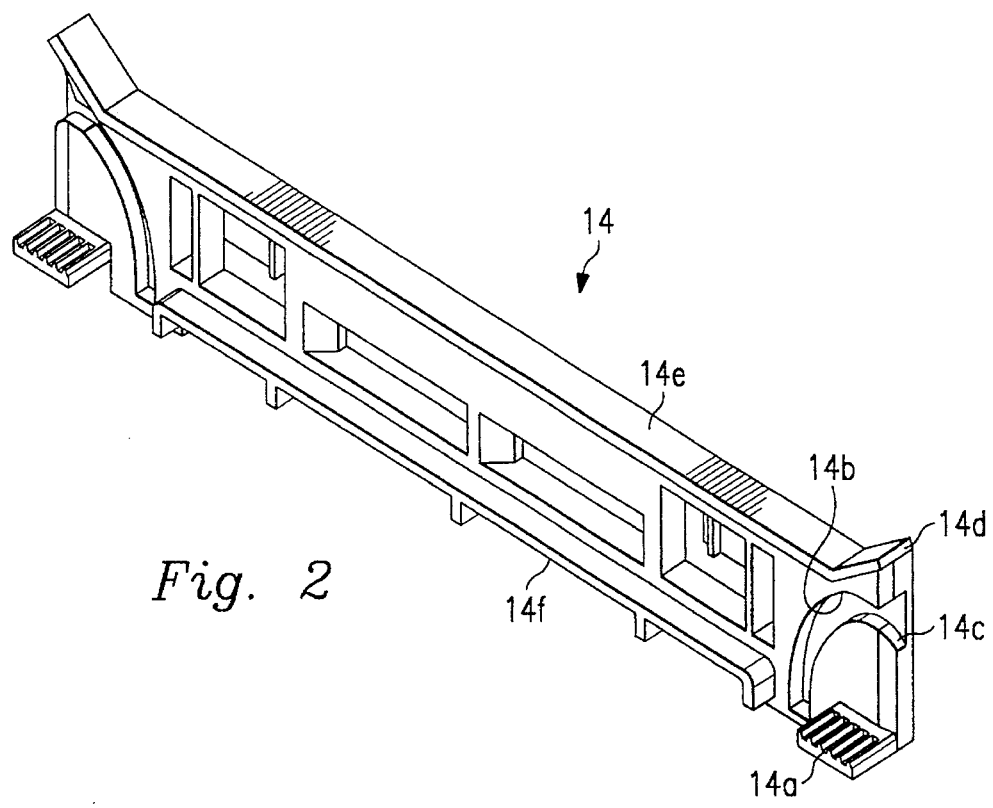
FIG. 2 is a perspective view of a mounting rail shown in FIGS. 1A–B.

FIG. 2 is a perspective view of one of the mounting rails 14 shown in FIGS. 1A–B. The mounting rail 14 includes a rack 14a, an alignment groove 14b having an expanded opening 14c, and a snap grip 14d. Additionally, the mounting rail includes an upper guide 14e and a lower guide 14f. It is understood that two mounting rails 14 are used in connection with the door/filler 12, where one mounting rail 14 is placed on either side of a bay to engage both ends of the door/filler 12. It should be noted that, in order to decrease manufacturing costs, the mounting rail 14 as shown is designed with mirror image ends to allow each mounting rail 14 to be used as either a right or left mounting rail.

As will be shown in connection with FIG. 7B, a device placed in the carrier is connected to the computer system by means of a connector located at the back of the carrier and a connector located on a system board at the back of the bay. When the door/filler 12 is used in connection with a carrier, the upper guide 14e and lower guide 14f slidably engage the top and bottom of the carrier to restrict the horizontal movement of the carrier as it slides within the mounting rails 14. Accordingly, when mounting rails 14 are properly located within a bay, the guides 14e, 14f assure that the connector of a device placed in the carrier will properly mate with the system board connector located at the back of the bay as the device slides within the mounts 14.

As will be more fully discussed below, the rack 14a is used to permit the door/filler 12 to rotate into the open or closed positions and to cause an attached carrier to slide within the mounts 14 to permit a connection between a device and system board. Additionally, the alignment groove 14b guides the door/filler 12 as it travels between the open and closed position, while the snap grip 14d aids in securing the door/filler 12 closed.

Figure 3:
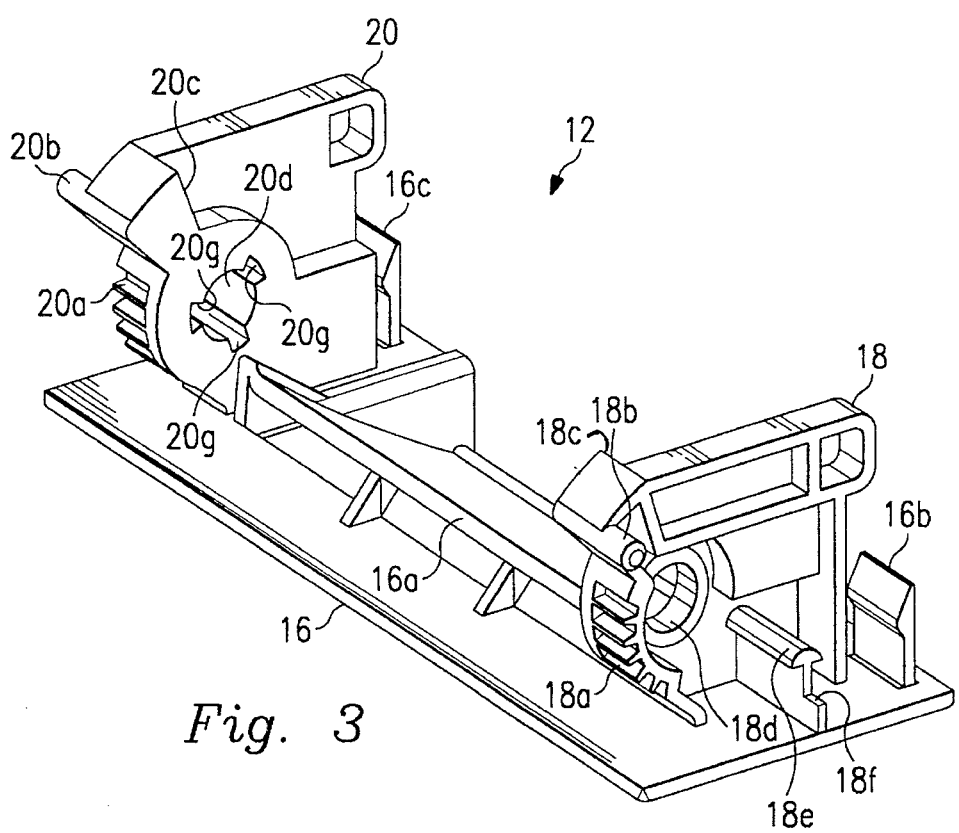
FIG. 3 is a perspective view of the door/filler shown in FIGS. 1A–B.

FIG. 3 is a perspective view of the door/filler 12 shown in FIGS. 1A–B. The door/filler 12 consists of a door face 16 and two side mounts 18 and 20. The door face 16 includes a handle 16a proximate the center of the face 16, and two snaps 16b and 16c located at both ends of the door face 16. The door face 16 is sized to seal a bay opening in a computer chassis (shown in FIGS. 7A–B) when the door/filler 12 is in the fully closed position. The handle 16a is formed by angling a portion of the door face 16a such that an individual may insert his or her fingers under the handle to open and close the door/filler 12. By forming the handle 16a from a portion of the door face 16 the handle 16a is able to serve as both a hand grip and an air louvre which allows air to circulate around the handle 16a and into the chassis bay to cool the device and system components. The snaps 16b, 16c, as will be discussed more fully in connection with FIG. 6, secure the door face 16 flush to the chassis around the bay opening when the door/filler 12 is in the fully closed position.

The two side mounts 18, 20 are attached one to each end of the door face 16. Each side mount 18, 20, respectively, contains a pinion gear 18a, 20a, a guide pin 18b, 20b, and a stop 18c, 20c. Proximate each pinion gear 18a, 20a in each side mount 18, 20 is an opening 18d, 20d. An alignment rib 18e, 20e (20e not shown in this perspective) and a stop tab 18f, 20f (20f not shown in this perspective) are also attached to each side mount 18, 20. Further, proximate opening 20d in mount 20 are three alignment notches 20g. It is understood that the side mounts 18, 20 in connection with the mounting rails 14 enable the door/filler 12 to open and close.

It is also understood that the door/filler 12 may be used alone as a filler panel or attached to a carrier (as shown in FIG. 1B) and used as a carrier door. In order to provide a connection between the carrier and door/filler 12, each mount 18, 20 contains the opening 18d, 20d, respectively, which allows the door/filler 12 to be removably secured to a carrier by means of posts, mounted on either side of the carrier, and which are inserted into the openings 18d, 20d. One of the mounts 20 contains alignment notches 20g adjacent the opening 20d which are designed to mate with tabs placed on one of the posts located on the carrier such that the door/filler 12 may only be inserted onto the carrier in one orientation. The openings 18d, 20d are sized such that when the carrier is secured to the door/filler 12 the door/filler 12 is permitted to freely rotate about the carrier posts.

Figure 4:
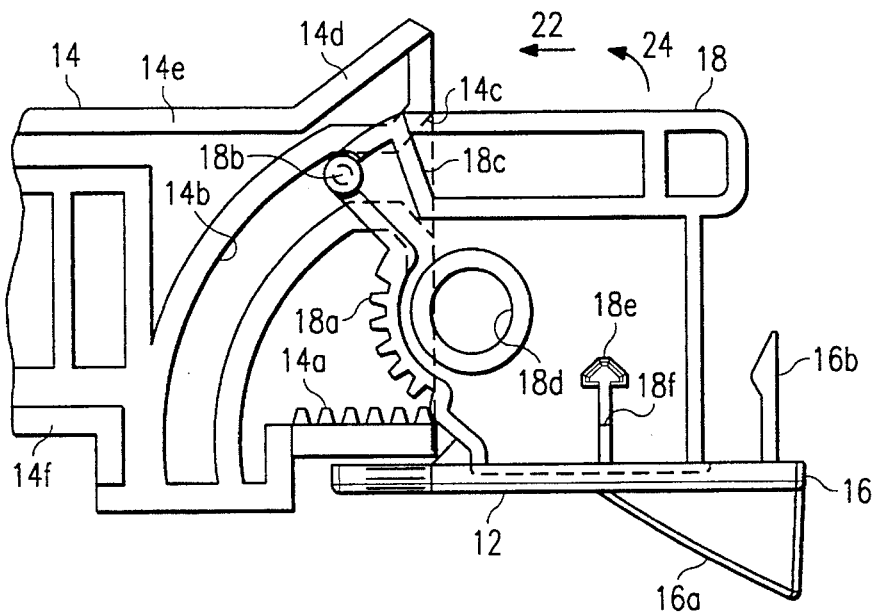
FIG. 4 is a cut-away view of the door/filler and mounting rail of FIGS. 1A–B with the door/filler in the open position.
Figure 5:
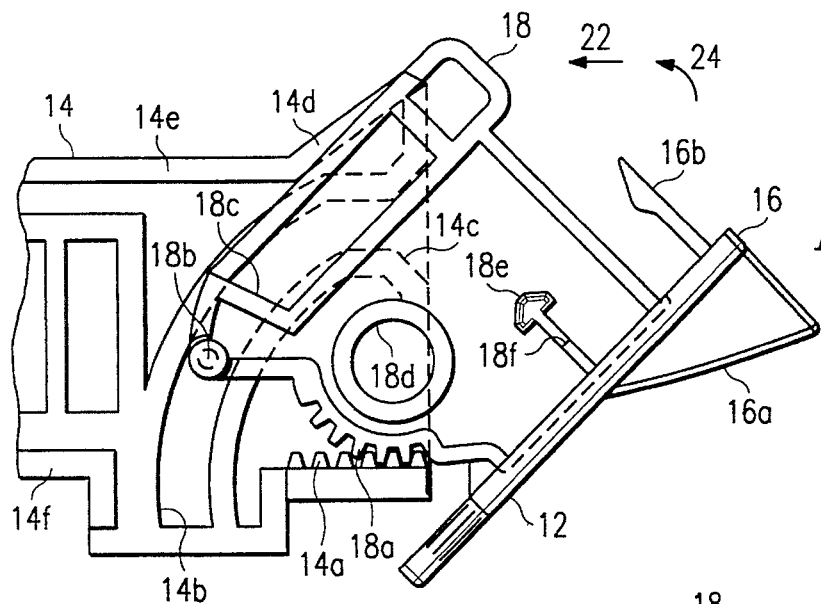
FIG. 5 is a cut-away view of the door/filler and mounting rail of FIGS. 1A–B with the door/filler in the partially closed position.

Operation of the door/filler 12 in connection with mounts 14 will now be discussed in connection with FIGS. 4–6. FIG. 4 is a cut-away view of the door/filler 12 along the side holding mount 18 and one mounting rail 14 with the door/filler 12 inserted into the mounting rail 14 in the fully open position (horizontal in this perspective). The door/filler 12 has been inserted into mounting rail 14 in the direction indicated by arrow 22. As the door/filler 12 was inserted into mounting rail 14 the guide pin 18b entered the alignment groove 14b through the expanded opening 14c. The expanded opening 14c is designed to enable the guide pin 18b to more easily enter the alignment groove 14b. With the guide pin 18b inserted into the alignment groove 14b the pinion gear 18a begins to mate with the rack 14a. Although not shown, the mount 20 operates identically in connection with a second mounting rail 14. In FIG. 5 the door/filler 12 of FIG. 4 has begun to close and has been rotated approximately 45 degrees, relative to FIG. 4, through arc 24. As the door face 20 was rotated through arc 24, the pinion gear 18a meshed with the rack 14a causing the carrier door 12 to simultaneously rotate through arc 24 and to travel horizontally (in this perspective) toward the mounting rail 14 in the direction of arrow 22. As the carrier door 12 rotated about arc 24 and traveled horizontally toward the mounting rail 14, the guide pin 18b traveled within the alignment groove 14b. It is understood that the alignment groove 14b is constructed with such an arc as to account for both the rotational and horizontal movement of the filler/door 12 as it opens and closes. As a result of the interaction between the pinion gear 18a and rack 14a, and guide pin 18b and alignment groove 14b, the opening 18d remains in a constant horizontal plane as the door/filler 12 is closed.

When a carrier (shown in FIG. 1B) is attached to the door/filler 12 by means of posts which rotate within opening 18d the door/filler 12 thus imparts a horizontal motion to the carrier by means of the horizontal movement of the opening 18d. Accordingly, an attached carrier slides in the direction of arrow 22 between the upper guide 14e and lower guide 14f within the mounting rails 14 in a constant horizontal plane such that the device may mate with a connector secured behind the carrier.

Figure 6:
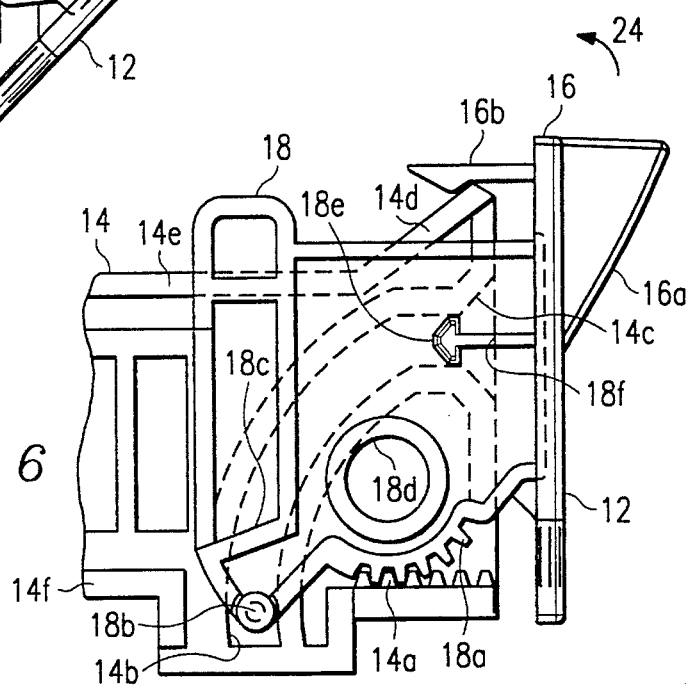
FIG. 6 is a cut-away view of the door/filler and mounting rails as shown in FIGS. 1A–B with the door/filler in the fully closed position.

In FIG. 6 the door/filler 12 of FIGS. 4 and 5 has been rotated approximately 90 degrees, relative to FIG. 4, through arc 24 and is now fully closed (as shown in FIGS. 1A–B). With the door/filler 12 in the fully closed position the door face 16 is in a vertical position (in this perspective) and is sized to seal the bay opening in a computer chassis (shown in FIGS. 7A–B). As the door face 20 was rotated through arc 24 the pinion gear 18a continued to mesh with the rack 14a, thus causing the door/filler 12 to continue to rotate relative to opening 18d and travel horizontally in the direction of arrow 22 toward the mounting rail 14. As the door/filler 12 rotated about the opening 18d and traveled horizontally toward the mounting rail 14, the guide pin 18b continued to travel within the alignment groove 14b to assure proper alignment of the door/filler 12 relative to the mounting rail 14.

When the door face 16 approached the vertical position, the alignment rib 18e entered the alignment groove 14b through the expanded opening 14c. The alignment rib 18e then passed through the expanded opening and engaged the sides of the alignment groove 14b to assure that the door/filler 12 is properly located relative to the mounting rail 14. As the door face 16 closed, the snap 16b flexed and passed over the snap grip 14d securing the door face 16 to the mounting rail 14. The stop 18e then engaged the front of the mounting rail 14 to prevent further horizontal movement of the door/filler 12 (in the direction of arrow 22) and rotational movement of the door/filler 12 (in the direction of arc 24).

As a result of the interaction between the pinion gears 18a and rack 14a, and guide pin 18b and alignment groove 14b, the opening 18d remained in a constant horizontal plane as the door/filler 12 was closed. This allows an attached carrier to slide between the upper guard 14e and lower guard 14f of the mounting rails 14 in a constant horizontal plane such that a connector attached to the back of a device secured within an attached carrier will mate with a connector attached to the system board at the end of the bay (shown in FIG. 7B). The pinion gear 18a and the rack 14a act as a mechanical lever to move an attached carrier horizontally (in the direction of arrow 22) and to create sufficient and consistent force to insert the device connector into the system board connector.

It is further understood that the door/filler 12 is opened in a reverse manner to that described in connection with FIGS. 4–6. As the door/filler 12 is opened, the snap 16b flexes over grip 14d thus permitting the door/filler to rotate in a direction opposite to the arc 24 and move horizontally in a direction opposite the arrow 22. The mechanical lever created by the combination of pinion gear 18a and rack 14a similarly creates the necessary force to remove the device from the system board connector, and thus permits an attached carrier to slide from mounts 14 when the door/filler 12 is fully opened.

Figure 7A:
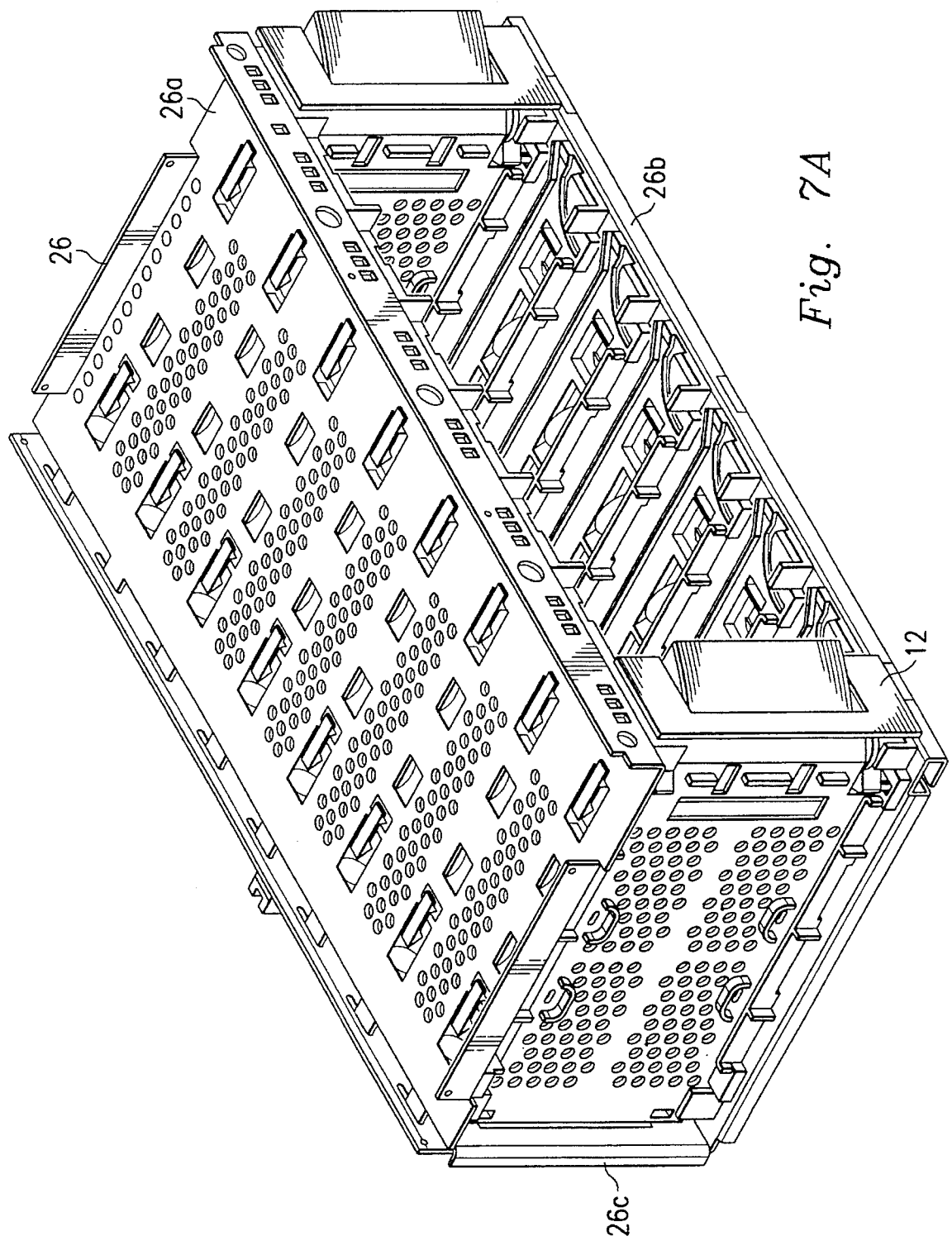
FIG. 7A is a perspective view of the computer device carrier and bay filler panel combination shown in FIGS. 1A–B installed in a computer chassis.

FIG. 7A is a perspective view of the computer device carrier and bay filler panel combination shown in FIGS. 1A–B installed in a computer chassis 26. The computer chassis 26 is comprised of two sides 26a, 26b and back 26c. As shown, a pair of mounting rails 14 are secured opposite each other, one to each side 26a, 26b, within the chassis 26 to form a bay. A door/filler 12, with or without a carrier 15, is then attached to the mounting rails 14 as described above, such that the door/filler 12 seals the bay opening in the chassis 26 when the door/filler 12 is closed.

FIG. 7B is a partial overhead view of the computer device carrier and bay filler panel combination installed in a computer chassis as shown in FIG. 7A, with the attached carrier partially removed from the computer chassis 26. As shown, a system board 28 with an attached system board connector 28a is secured at the back 26c of the computer chassis 26. Also shown is a computer device 30, such as a hard drive or other storage device, secured within the carrier 15. As discussed above, the carrier 15 is inserted into the mounting rails 14 and slid relative to the mounting rails 14 until the door/filler 12 engages the mounting rails 14. By closing the door/filler 12 as described above, a device connector (not shown) at the back of the carrier 15 is inserted into the connector 28a, thus electrically connecting the device 30 to the system board 28. By opening the door/filler 12 as described above, the device connector is removed from the connector 28a, disconnecting the device 30 from the system board 28 and allowing the device 30 and carrier 15 to be removed from the chassis 26.

Several technical advantages result from the foregoing. Because the door/filler 12 is guided into the mounting rails 14 by the rack 14a and pinions 18a, 20a in connection with the guide pins 18b, 20b and alignment groove 14b, the door/filler 12 does not require a carrier for proper insertion, particularly when the door/filler 12 is utilized without an attached carrier. By the use of the rack 14a and pinion 18a, 20a construction the carrier is always maintained in a horizontal plane relative to the mounting rails 14, which leads to consistent insertion and extraction of an attached device from the system board. By utilizing a carrier door 12 as a filler panel, manufacturers are able to eliminate a separate filler panel from inventory and further not require the use of a full carrier to serve as a filler panel.

Although an illustrative embodiment of the invention has been shown and described, other modifications, changes, and substitutions are intended in the foregoing disclosure. For example, the door/filler 12 need only contain a single mount 18, 20 and/or snap 16b, 16c; various other latching mechanisms apart from the snap 16b, 16c and grip 14d could be used to secure the door/filler 12 to the mounting rail 14; the alignment rib 18e is not required; the handle 16a need not be formed from the door face 20; and the carrier can be secured to the door/filler 12 in any manner that permits independent movement of the carrier and door/filler 12. Accordingly, it is appropriate that the appended claims be construed broadly and in a manner consistent with the scope of the invention.

What is claimed is:

1. A door and mounting apparatus comprising:

a door having a mount attached thereto; and a mounting rail for engaging said mount and having an arcuate alignment channel with one open end and an attached rack;

said mount further comprising a pinion gear to rotatably engage said rack as said door is opened and closed and a guide pin which enters said open end of said channel when said door is open and travels within said channel as said door is opened and closed.

2. The door and mounting apparatus of claim 1 further comprising:

a snap grip attached to said mounting rail; and a snap attached to said door wherein said snap engages said grip when said door is closed.

3. The door and mounting apparatus of claim 1 wherein an alignment rib is attached to said door and which extends within said open end of said channel when said door is closed.

4. The door and mounting apparatus of claim 1 wherein a stop tab is attached to said door and which engages said rail when said door is closed.

5. The door and mounting apparatus of claim 1 wherein said rail has a first end and a second end, said first and second ends being mirror images such that said rail may be used with said door when said mount is attached to either side of said door.

6. The door and mounting apparatus of claim 1 further comprising:

a device carrier rotatably attached to said door and which slidably engages said mounting rail.

7. The door and mounting apparatus of claim 6 wherein said mounting rail contains a guide which engages said carrier to permit said carrier to slidably engage said rail.

8. The door and mounting apparatus of claim 6 wherein said mounting rail contains an upper guide and a lower guide between which said carrier is allowed to slide.

9. The door and mounting apparatus of claim 6 wherein said device carrier is designed to secure a removable storage device.

10. The door and mounting apparatus of claim 1 wherein said door has a second mount attached thereto, and further comprising:

a second mounting rail for engaging said second mount.

11. The door and mounting apparatus of claim 10 wherein said mounting rails are interchangeable.

12. The carrier door and mounting apparatus of claim 10 wherein said mounts are rotatably attached to a carrier.

13. The carrier door and mounting apparatus of claim 10 wherein said mounts each contain a pivot hole, and further comprising:

a carrier containing a pair of posts such that one post is insertable in each pivot hole to rotatably attach said carrier to said door.

14. The carrier door and mounting apparatus of claim 13 wherein one of said mounts contains alignment notches proximate said pivot hole, and one of said posts contains a corresponding number of tabs which permits said tabbed post to be inserted into said notched hole in only one orientation and may not be inserted into said other pivot hole.

15. The door and mounting apparatus of claim 1 wherein a handle is attached to said door.

16. The door and mounting apparatus of claim 15 wherein said handle is comprised of a section of said door leaving an opening in said door to permit passage of air therethrough.

17. A door and mounting apparatus for use in a computer chassis having a bay therein comprising:

a door having a mount attached thereto to seal the bay when the door is closed;

a mounting rail attached to the chassis within the bay for engaging the mount and having an arcuate alignment channel with one open end and an attached rack;

the mount further comprising a pinion gear to rotatably engage the rack as the door is opened and closed and a guide pin which enters the open end of the channel when the door is open and travels within the channel as the door is opened and closed.

18. A computer chassis bay door and mounting apparatus for use in a computer chassis having a bay therein comprising:

a door for sealing said bay and having a first mount attached thereto; and a first mounting rail secured within said bay for engaging said mount and having an arcuate alignment channel with one open end and an attached rack extending within said bay;

said mount further comprising a guide pin which enters said open end of said channel when said door is open, and a pinion gear to rotatably engage said rack such that as said door is rotated closed about said rack and said pin travels within said channel.

19. The computer chassis bay door and mounting apparatus of claim 18 further comprising:

a snap grip attached to said mounting rail; and a snap attached to said door wherein said snap engages said grip when said door is closed.

20. The computer chassis bay door and mounting apparatus of claim 18 wherein an alignment rib is attached to said door and which extends within said open end of said channel when said door is closed.

21. The computer chassis bay door and mounting apparatus of claim 18 wherein a stop tab is attached to said door and which engages said rail when said door is closed.

22. The computer chassis bay door and mounting apparatus of claim 18 wherein said door has a second mount attached thereto, said first and second mounts attached to opposite ends of said door and further comprising:

a second mounting rail secured within said bay, said first and second rails attached to opposite sides of said bay such that said first mount engages said first rail and said second mount engages said second rail.

23. The computer chassis bay door and mounting apparatus of claim 18 further comprising:

a device carrier rotatably attached to said door and which slidably engages said mounting rail for insertion into said bay.

24. The computer chassis bay door and mounting apparatus of claim 23 wherein as said door is closed said carrier is inserted into said bay in a direction parallel to said rail.

25. The computer chassis bay door and mounting apparatus of claim 23 wherein said device carrier is designed to secure a removable storage device.

26. A computer chassis bay door and mounting apparatus for use in a computer chassis having a bay therein, with a computer system board within the chassis and having a system connector at the rear of the bay, comprising:

a door for sealing said bay and having a first mount attached thereto; and a first mounting rail secured within said bay for engaging said mount and having an arcuate alignment channel with one open end and an attached rack extending within said bay;

said mount further comprising a guide pin which enters said open end of said channel when said door is open, and a pinion gear to rotatably engage said rack such that as said door is rotated closed about said rack and said pin travels within said channel;

a device carrier, designed to secure a removable storage device, rotatably attached to said door and which slidably engages said mounting rail for insertion into said bay.

27. The computer chassis bay door and mounting apparatus of claim 26 wherein said carrier contains a carrier connector at the rear of said carrier for connecting said device to said system board by said system connector, whereas closing said door inserts said carrier into said bay and causes said carrier connector to connect to said system connector.

28. The computer chassis bay door and mounting apparatus of claim 26 wherein said carrier contains a carrier connector at the rear of said carrier for connecting said device to said system board by said system connector, whereas upon closing or opening said door, said rack and said pinion create sufficient mechanical force to insert or remove, respectively, said carrier into or from said bay and cause said carrier connector to connect to or disconnect from said system connector.

* * * * *